United States Patent
Marrow et al.

(10) Patent No.: US 10,157,637 B1
(45) Date of Patent: Dec. 18, 2018

(54) SAMPLING FOR MULTI-READER MAGNETIC RECORDING

(71) Applicant: Seagate Technology LLC, Cupertino, CA (US)

(72) Inventors: Marcus Marrow, San Jose, CA (US); Jason Bellorado, San Jose, CA (US); Zheng Wu, San Jose, CA (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 15/722,641

(22) Filed: Oct. 2, 2017

Related U.S. Application Data

(60) Provisional application No. 62/522,248, filed on Jun. 20, 2017.

(51) Int. Cl.
  *G11B 5/09* (2006.01)
  *G11B 20/10* (2006.01)

(52) U.S. Cl.
  CPC .. *G11B 20/10222* (2013.01); *G11B 20/10037* (2013.01)

(58) Field of Classification Search
  CPC .............. G11B 20/10046; G11B 5/012; G11B 20/10009; G11B 20/10037; G11B 5/3964; G11B 5/4076; G11B 2220/20; G11B 20/14013; G11B 15/1875; G11B 15/44; G11B 5/0005; G11B 5/59633
  USPC ....... 360/39, 51, 75, 77.14, 73.08, 73.07, 65
  See application file for complete search history.

(56) References Cited

U.S. PATENT DOCUMENTS

| | | | |
|---|---|---|---|
| 5,321,564 A | 6/1994 | Takahashi |
| 5,742,532 A | 4/1998 | Duyne et al. |
| 5,970,093 A | 10/1999 | Lantremange |
| 6,157,510 A | 12/2000 | Schreck et al. |
| 6,320,920 B1 | 11/2001 | Beyke |
| 6,377,552 B1 | 4/2002 | Moran et al. |
| 6,670,901 B2 | 12/2003 | Brueske et al. |
| 6,687,073 B1 | 2/2004 | Kupferman |
| 6,697,891 B2 | 2/2004 | Emberty et al. |
| 6,738,215 B2 | 5/2004 | Yatsu |
| 6,950,258 B2 | 9/2005 | Takaishi |
| 6,993,291 B2 | 1/2006 | Parssinen et al. |
| 7,046,701 B2 | 5/2006 | Mohseni et al. |

(Continued)

OTHER PUBLICATIONS

Bellorado et al., "Target Parameter Adaptation", U.S. Appl. No. 15/334,167, filed Oct. 25, 2016, Seagate Technology LLC.

*Primary Examiner* — Nabil Hindi
(74) *Attorney, Agent, or Firm* — Cesari & Reed, LLP; Kirk A. Cesari; Christian W. Best

(57) ABSTRACT

Systems and methods are disclosed for sampling signals in multi-reader magnetic recording. In certain embodiments, an apparatus may comprise a plurality of read heads configured to simultaneously read from a single track of a storage medium, a plurality of analog to digital converters (ADCs) configured to receive signal patterns from corresponding read heads, and a circuit configured to control the plurality of ADCs to sample the signal patterns according to a single clock signal generator. The output of the ADCs may be individually delayed based on a down-track offset of the read heads in order to align the samples, so that samples corresponding to the same portion of the recorded signal can be combined for bit pattern detection.

17 Claims, 9 Drawing Sheets

(56) References Cited

U.S. PATENT DOCUMENTS

| | | |
|---|---|---|
| 7,133,233 B1 | 11/2006 | Ray et al. |
| 7,245,448 B2 | 7/2007 | Urata |
| 7,298,573 B2 | 11/2007 | Kitamura |
| 7,324,437 B1 | 1/2008 | Czylwik et al. |
| 7,362,432 B2 | 4/2008 | Roth |
| 7,940,667 B1 | 5/2011 | Coady |
| 8,139,301 B1 | 3/2012 | Li et al. |
| 8,172,755 B2 | 5/2012 | Song et al. |
| 8,400,726 B1 | 3/2013 | Wu et al. |
| 8,456,977 B2 | 6/2013 | Honma |
| 8,479,086 B2 | 7/2013 | Xia et al. |
| 8,514,506 B1 | 8/2013 | Li et al. |
| 8,539,328 B2 | 9/2013 | Jin et al. |
| 8,542,766 B2 | 9/2013 | Chekhovstov et al. |
| 8,713,413 B1 | 4/2014 | Bellorado et al. |
| 8,755,139 B1 | 6/2014 | Zou et al. |
| 8,760,794 B1 | 6/2014 | Coker et al. |
| 8,837,068 B1 | 9/2014 | Liao et al. |
| 8,861,111 B1 | 10/2014 | Liao et al. |
| 8,861,112 B1 | 10/2014 | Pan et al. |
| 8,953,276 B1 | 2/2015 | Pokharel |
| 9,007,707 B1 | 4/2015 | Lu et al. |
| 9,019,642 B1 | 4/2015 | Xia et al. |
| 9,064,537 B1 | 6/2015 | Nie |
| 9,082,418 B2 | 7/2015 | Ong et al. |
| 9,093,115 B1 | 7/2015 | Fung et al. |
| 9,099,132 B1 | 8/2015 | Grundvig et al. |
| 9,129,650 B2 | 9/2015 | Mathew et al. |
| 9,147,416 B2 | 9/2015 | Grundvig et al. |
| 9,196,298 B1 | 11/2015 | Zhang et al. |
| 9,245,579 B2 | 1/2016 | Song et al. |
| 9,245,580 B1 | 1/2016 | Lu et al. |
| 9,257,135 B2 | 2/2016 | Ong et al. |
| 9,257,145 B1 | 2/2016 | Soderbloom et al. |
| 9,286,915 B1 | 3/2016 | Dziak et al. |
| 9,311,937 B2 | 4/2016 | Zou et al. |
| 9,401,161 B1 | 7/2016 | Jury |
| 9,424,878 B1 | 8/2016 | Dziak et al. |
| 9,431,052 B2 * | 8/2016 | Oberg ............ G11B 20/10037 |
| 9,508,369 B2 | 11/2016 | Chu et al. |
| 9,542,972 B1 | 1/2017 | Nayak et al. |
| 9,564,157 B1 | 2/2017 | Trantham |
| 9,590,803 B2 | 3/2017 | Derras et al. |
| 9,672,850 B2 | 6/2017 | Grundvig et al. |
| 9,728,221 B2 | 8/2017 | Oberg et al. |
| 9,947,362 B1 | 4/2018 | Venkataramani et al. |
| 2002/0181439 A1 | 12/2002 | Orihashi et al. |
| 2003/0198165 A1 | 10/2003 | Mouri et al. |
| 2010/0290153 A1 | 11/2010 | Hampshire |
| 2011/0090773 A1 | 4/2011 | Yu et al. |
| 2011/0176400 A1 | 7/2011 | Gerasimov |
| 2012/0105994 A1 | 5/2012 | Bellorado et al. |
| 2012/0155577 A1 | 6/2012 | Shukla et al. |
| 2017/0249206 A1 | 8/2017 | Jeong et al. |

\* cited by examiner

500

| DELAY[5:0] | DELAY (T) | W[0] | W[1] | W[2] | W[3] | W[4] | W[5] |
|---|---|---|---|---|---|---|---|
| 0 | 0 | 0 | 0 | 127 | 0 | 0 | 0 |
| 1 | 1/64 | 1 | -2 | 127 | 2 | -1 | 0 |
| 2 | 2/64 | 1 | -3 | 127 | 4 | -1 | 0 |
| 3 | 3/64 | 2 | -5 | 127 | 5 | -2 | 0 |
| 4 | 4/64 | 2 | -6 | 126 | 7 | -2 | 1 |
| 5 | 5/64 | 2 | -8 | 126 | 9 | -3 | 1 |
| 6 | 6/64 | 3 | -9 | 125 | 12 | -4 | 1 |
| 7 | 7/64 | 3 | -10 | 124 | 14 | -4 | 1 |
| 8 | 8/64 | 4 | -11 | 123 | 16 | -5 | 1 |
| 9 | 9/64 | 4 | -13 | 123 | 18 | -5 | 2 |
| 10 | 10/64 | 4 | -14 | 122 | 20 | -6 | 2 |
| 11 | 11/64 | 5 | -15 | 120 | 23 | -7 | 2 |
| 12 | 12/64 | 5 | -15 | 119 | 25 | -8 | 2 |
| 13 | 13/64 | 5 | -16 | 118 | 28 | -8 | 2 |
| 14 | 14/64 | 5 | -17 | 116 | 30 | -9 | 3 |
| 15 | 15/64 | 6 | -18 | 115 | 33 | -10 | 3 |
| 16 | 16/64 | 6 | -18 | 113 | 35 | -10 | 3 |
| 17 | 17/64 | 6 | -19 | 112 | 38 | -11 | 3 |
| 18 | 18/64 | 6 | -19 | 110 | 40 | -12 | 3 |
| 19 | 19/64 | 6 | -20 | 108 | 43 | -12 | 4 |
| 20 | 20/64 | 6 | -20 | 106 | 46 | -13 | 4 |
| 21 | 21/64 | 6 | -20 | 104 | 48 | -14 | 4 |
| 22 | 22/64 | 6 | -20 | 102 | 51 | -14 | 4 |
| 23 | 23/64 | 6 | -20 | 100 | 54 | -15 | 4 |
| 24 | 24/64 | 6 | -21 | 98 | 57 | -15 | 5 |
| 25 | 25/64 | 6 | -21 | 95 | 59 | -16 | 5 |
| 26 | 26/64 | 6 | -21 | 93 | 62 | -17 | 5 |
| 27 | 27/64 | 6 | -20 | 91 | 65 | -17 | 5 |
| 28 | 28/64 | 6 | -20 | 88 | 67 | -18 | 5 |
| 29 | 29/64 | 6 | -20 | 86 | 70 | -18 | 5 |
| 30 | 30/64 | 6 | -20 | 83 | 73 | -19 | 6 |
| 31 | 31/64 | 6 | -20 | 81 | 75 | -19 | 6 |
| 32 | 32/64 | 6 | -19 | 78 | 78 | -19 | 6 |
| 33 | 33/64 | 6 | -19 | 75 | 81 | -20 | 6 |
| 34 | 34/64 | 6 | -19 | 73 | 83 | -20 | 6 |
| 35 | 35/64 | 5 | -18 | 70 | 86 | -20 | 6 |
| 36 | 36/64 | 5 | -18 | 67 | 88 | -20 | 6 |
| 37 | 37/64 | 5 | -17 | 65 | 91 | -20 | 6 |
| 38 | 38/64 | 5 | -17 | 62 | 93 | -21 | 6 |
| 39 | 39/64 | 5 | -16 | 59 | 95 | -21 | 6 |
| 40 | 40/64 | 5 | -15 | 57 | 98 | -21 | 6 |
| 41 | 41/64 | 4 | -15 | 54 | 100 | -20 | 6 |
| 42 | 42/64 | 4 | -14 | 51 | 102 | -20 | 6 |
| 43 | 43/64 | 4 | -14 | 48 | 104 | -20 | 6 |
| 44 | 44/64 | 4 | -13 | 46 | 106 | -20 | 6 |
| 45 | 45/64 | 4 | -12 | 43 | 108 | -20 | 6 |
| 46 | 46/64 | 3 | -12 | 40 | 110 | -19 | 6 |
| 47 | 47/64 | 3 | -11 | 38 | 112 | -19 | 6 |
| 48 | 48/64 | 3 | -10 | 35 | 113 | -18 | 6 |
| 49 | 49/64 | 3 | -10 | 33 | 115 | -18 | 6 |
| 50 | 50/64 | 3 | -9 | 30 | 116 | -17 | 5 |
| 51 | 51/64 | 2 | -8 | 28 | 118 | -16 | 5 |
| 52 | 52/64 | 2 | -8 | 25 | 119 | -15 | 5 |
| 53 | 53/64 | 2 | -7 | 23 | 120 | -15 | 5 |
| 54 | 54/64 | 2 | -6 | 20 | 122 | -14 | 4 |
| 55 | 55/64 | 2 | -5 | 18 | 123 | -13 | 4 |
| 56 | 56/64 | 1 | -5 | 16 | 123 | -11 | 4 |
| 57 | 57/64 | 1 | -4 | 14 | 124 | -10 | 3 |
| 58 | 58/64 | 1 | -4 | 12 | 125 | -9 | 3 |
| 59 | 59/64 | 1 | -3 | 9 | 126 | -8 | 2 |
| 60 | 60/64 | 1 | -2 | 7 | 126 | -6 | 2 |
| 61 | 61/64 | 0 | -2 | 5 | 127 | -5 | 2 |
| 62 | 62/64 | 0 | -1 | 4 | 127 | -3 | 1 |
| 63 | 63/64 | 0 | -1 | 2 | 127 | -2 | 1 |

FIG. 5

SAMPLING FOR MULTI-READER MAGNETIC RECORDING

CROSS-REFERENCE TO RELATED APPLICATION

The present application is a non-provisional application of and claims priority to U.S. provisional patent application, Application No. 62/522,248, filed Jun. 20, 2017, entitled "MISO Systems and Methods", the contents of which are hereby incorporated by reference in their entirety.

SUMMARY

In certain embodiments, an apparatus may comprise a plurality of read heads configured to simultaneously read from a single track of a storage medium, a plurality of analog to digital converters (ADCs) configured to receive signal patterns from the plurality of read heads, and a circuit configured to control the plurality of ADCs to sample the signal patterns according to a single clock signal generator.

In certain embodiments, an apparatus may comprise a magnetic data storage medium, and a read/write (R/W) channel. The R/W channel may include a clock signal generator, a plurality of read heads configured to simultaneously read from a single track of the magnetic data storage medium, a plurality of analog to digital converters (ADCs) configured to receive signal patterns from the plurality of read heads, and a circuit configured to control the plurality of ADCs to sample the signal patterns according to the clock signal generator.

In certain embodiments, a method may comprise providing a plurality of read heads on a single actuator arm and configured to simultaneously read from a single track of a storage medium, providing a plurality of analog to digital converters (ADCs) configured to receive signal patterns from the plurality of read heads, and controlling the plurality of ADCs to sample the signal patterns according to a single clock signal generator.

BRIEF DESCRIPTION OF THE DRAWINGS

FIG. 5 is a table of delay circuit interpolation weights in a system configured to perform sampling for multi-reader magnetic recording, in accordance with certain embodiments of the present disclosure.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Methods and functions may be performed by modules, which may include one or more physical components of a computing device (e.g., logic, circuits, processors, etc.) configured to perform a particular task or job, or may include instructions that, when executed, can cause a processor to perform a particular task or job, or any combination thereof. Further, the methods described herein may be implemented as a computer readable storage medium or memory device including instructions that, when executed, cause a processor to perform the methods.

Figure 1:
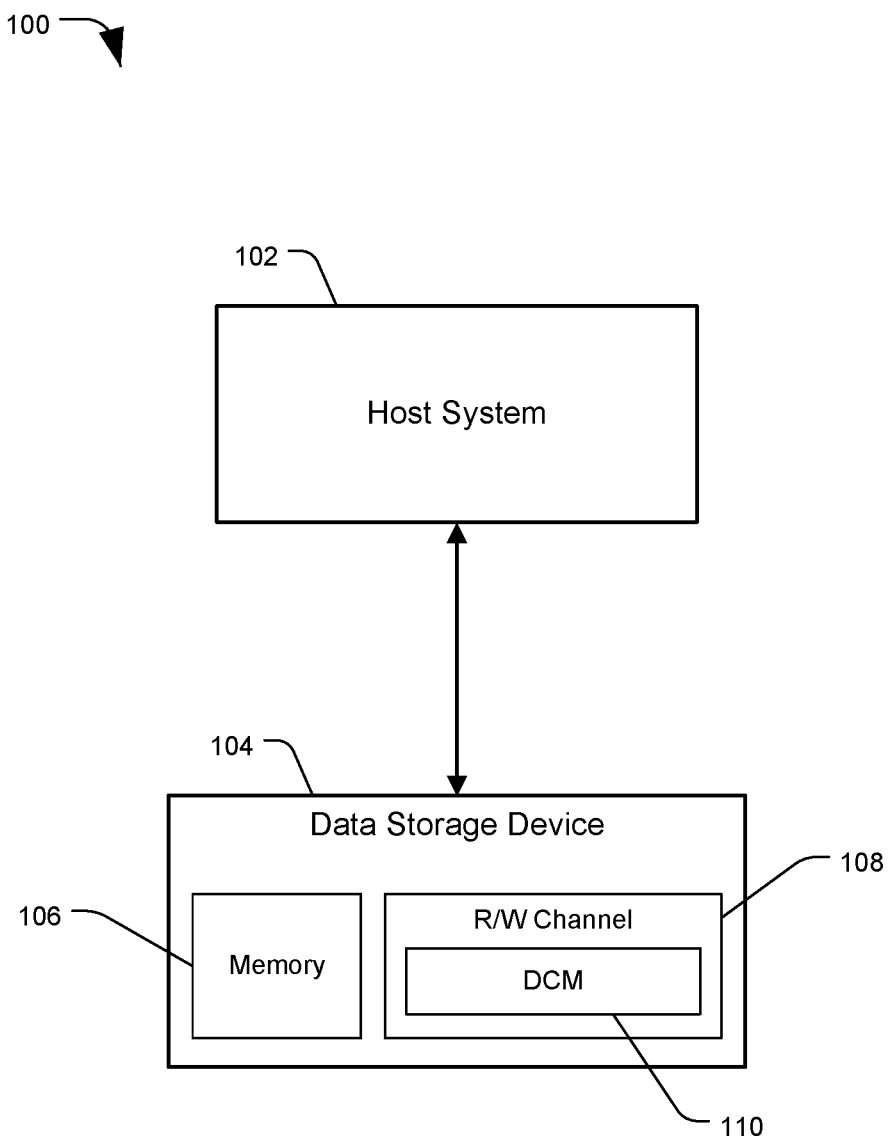
FIG. 1 is a diagram of a system configured to perform sampling for multi-reader magnetic recording, in accordance with certain embodiments of the present disclosure.

FIG. 1 is a diagram of a system configured to perform sampling for multi-reader magnetic recording, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a hard disc drive (HDD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a read/write (R/W) channel 108. The memory 106 may include a magnetic storage medium such as a hard disc, which may have data stored to concentric or spiral data tracks on the surface of the media. The tracks may be divided into zones, with each zone having a set of contiguous data tracks (e.g. an inner zone closest to the inner diameter (ID) or center of the disc, a middle zone, and an outer zone closest to the outer diameter (OD) or outer edge of the disc). Data can be stored to the tracks via setting localized polarity of magnetic fields on the surface of the disc. The magnetic fields may be detected by a reader element, sometimes called a read head, and the reader may generate a signal in the form of an analog waveform based on the detected magnetic fields. The R/W channel can receive and process the signal to obtain data, for example in the form of a sequence of bits. Similarly, digital data can be processed by the R/W channel 108 and converted into a signal that can be stored to the memory 106 via a writer or write head, by generating a magnetic field based on the signal. In some embodiments, the reader and writer elements may be referred to collectively as the "head(s)" of a data storage system. The heads may be located on a movable actuator arm that can be positioned over a desired location on the media, and as the media spins data can be read from or recorded to one or more tracks using the heads. The R/W channel 108 may comprise one or more circuits or processors configured to process signals for recording to or reading from the memory 106. During operation, the DSD 104 may receive a data access request, such as a read or write request, from the host device 102. In response, the DSD 104 may perform data access operations on the memory 106 via the R/W channel 108 based on the request.

The DSD 104 may be a multi-sensor magnetic recording (MSMR) system, which may use multiple reader elements over a single storage media surface to sense the magnetic field from the same track of the media simultaneously during a read operation. The signals detected from different heads can be combined in the R/W channel 108 to achieve a better performance of recovering the recorded signal (e.g. resulting in a lower bit error rate (BER)) than using a single head. Although the heads may be very close to each other on the arm, they may still be separated across the track as well as down the track. Since the heads may be located over different positions over the track, the signals each head detects may not be aligned in time, which can make combining the signals difficult.

Accordingly, DSD 104 may include a delay calibration module (DCM) 110, located within the R/W channel 108, a data storage controller, or elsewhere in the DSD 104. The DCM 110 may perform the methods and processes described herein to control the operation of multiple readers on a single clock domain, and apply delays to one or more detected signals such that the read signals are aligned in time and can be coherently combined. An example arrangement of reader elements in an MSMR system is depicted in regard to FIG. 2.

Figure 2:
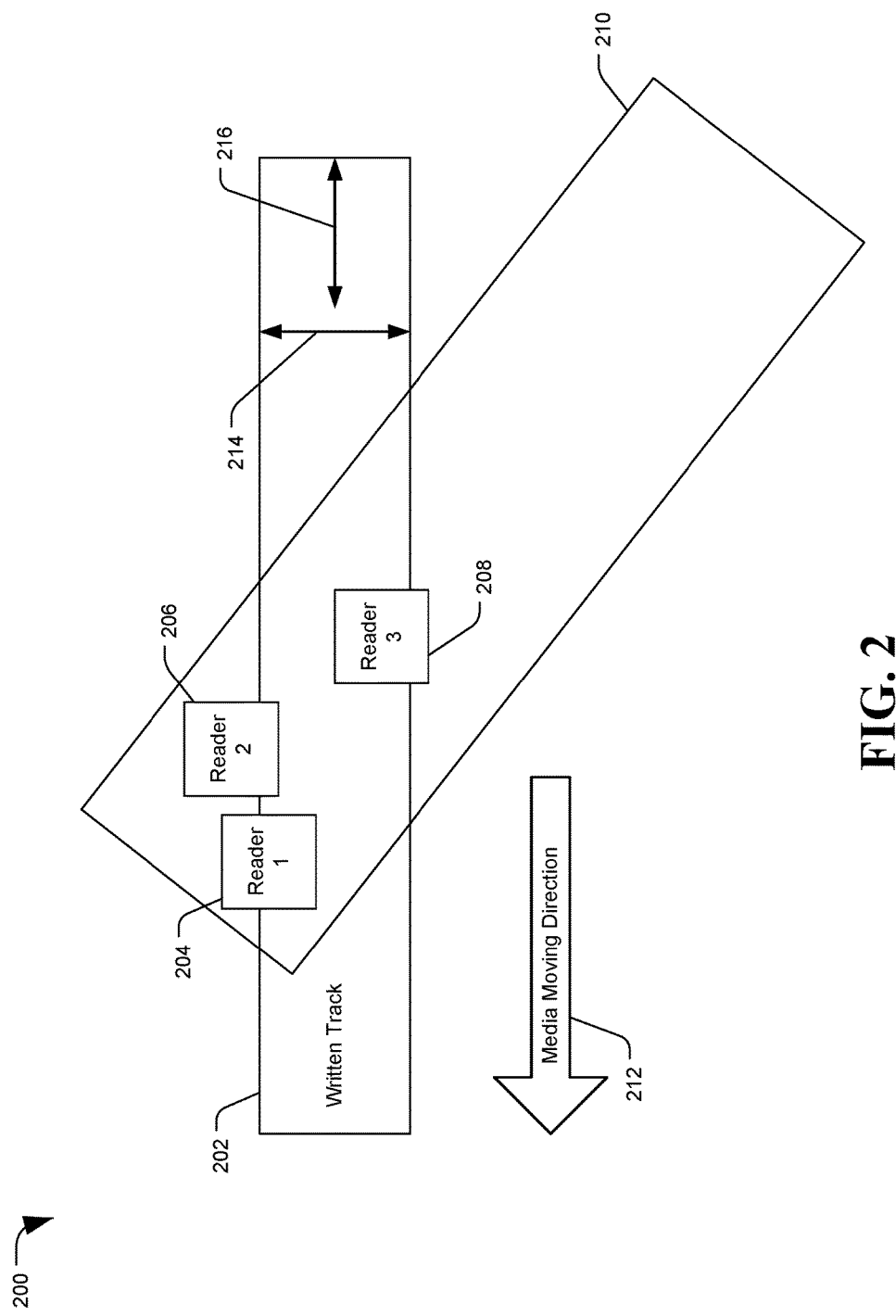
FIG. 2 is a diagram of a system configured to perform sampling for multi-reader magnetic recording, in accordance with certain embodiments of the present disclosure.

FIG. 2 is a diagram of a system configured to perform sampling for multi-reader magnetic recording, generally designated 200, in accordance with certain embodiments of the present disclosure. The system 200 includes a written data track 202 from a storage medium, such as a hard disc. The track 202 may have data recorded thereto by means of polarized magnetic fields along the track. In an MSMR system, a DSD may have a plurality (e.g. an integer "N") analog waveforms produced from the track 202 by a plurality ("N") read heads, such as reader 1 204, reader 2 206, and reader 3 208. Although three heads are depicted, more or fewer heads may also be used. The heads can each have a cross-track 214 and down-track 216 position, and may be offset from each other in a cross-track and down-track direction. Reader 1 204, reader 2 206, and reader 3 208 may be connected to an adjustable arm 210, which can position the readers over a desired track. The cross-track 214 and down-track 216 positioning and offset of each head may change from zone to zone or track to track, depending on the angle of the arm 210 relative to the media.

The arm 210 can position the heads over a desired track 202, and the track moves as the disc media spins, allowing the heads to read data from the entire track. The disc media may be spinning in the direction indicated by the arrow 212. In this example, reader 3 208 would be the leading head (e.g. the first head to read a specific location on the track), followed by reader 2 206, and then reader 1 204 would be the trailing head.

For readers that are fully or partially over a given track, the difference in down-track position may translate to a delay in the analog waveform from that head. Some signal decoding techniques may require these signals to be combined prior to the application of a SOVA (soft output Viterbi algorithm) equalizer. The combining process can align these signals in time. A delay may be introduced for at least one head so that the signals from each head for the same location are processed simultaneously by the DSD, allowing the signals to be combined coherently and the BER improved.

For example, assume reader 2 206 is trailing 0.5 milliseconds behind reader 3 208, and that reader 1 204 is trailing 0.5 milliseconds behind reader 2 206, and 1 millisecond behind reader 3 208. A delay calibration module (DCM), such as the DCM 110 of FIG. 1, could calibrate the delays for each head such that reader 3 208 has a 2 millisecond delay, reader 2 206 has a 1.5 millisecond delay, and reader 1 204 has a 1 millisecond delay. The signal from each reader will be combined after the corresponding delay elapses, allowing the same signal pattern from each head to be combined despite the physical and temporal offsets.

The operation of heads may be controlled by a clock signal generator. A clock signal generator may include an electronic oscillator that generates a clock signal used to control the functioning of circuit elements. A system may have multiple clock signal generators. Each clock signal generator may have a clock domain, which may include the memory elements directly clocked by that clock signal generator and certain elements attached to the outputs of the clocked elements. To avoid crossing clock domains, which may introduce delay uncertainty, the heads detecting the sampled waveform may be within a single clock domain. The alignment of signals detected by multiple heads in an MSMR system may require specific management of clock signal timing, and is discussed in greater detail in regard to FIG. 3.

Figure 3:
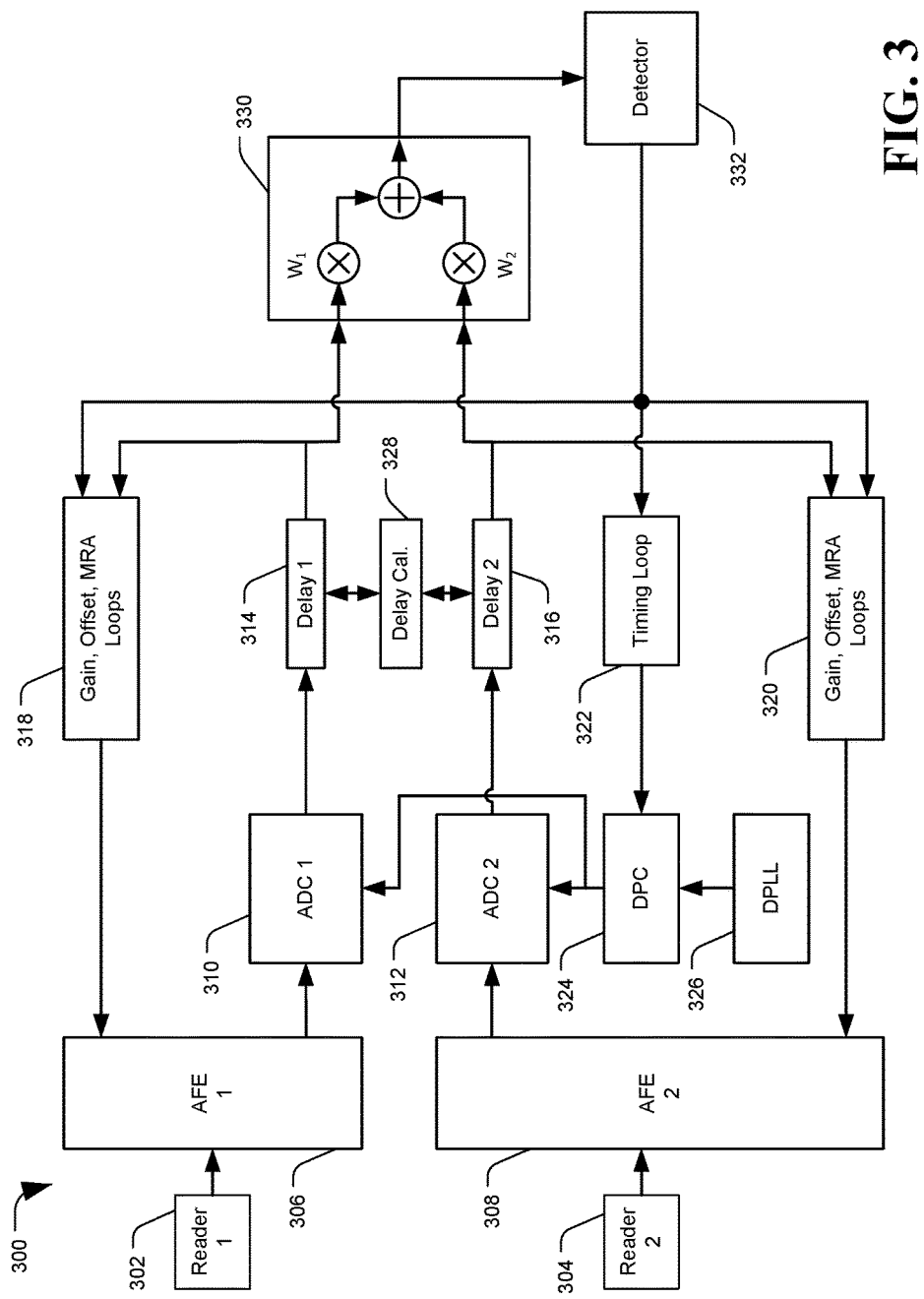
FIG. 3 is a diagram of a system configured to perform sampling for multi-reader magnetic recording, in accordance with certain embodiments of the present disclosure.

FIG. 3 is a diagram of a system configured to perform sampling for multi-reader magnetic recording, generally designated 300, in accordance with certain embodiments of the present disclosure. The system 300 may be part of a R/W channel, such as the R/W channel 108 of FIG. 1.

In an example hard disk drive (HDD) application with a single reader, read-back waveforms can be sampled using an analog-to-digital converter (ADC). In example embodiments, the read-back waveform may be sampled once per written bit (which may be referred to as Nyquist sampling) to avoid the onerous ADC design that may be required to oversample (e.g. sampling more than once per written bit) at high data rates with high precision, such as 6 bits or greater per sample. Under these conditions, the input waveform to the ADC typically has energy at the Nyquist frequency (e.g. half the sampling frequency or sampling rate, $f_s/2$) as removing this energy would require a very high order anti-aliasing filter which would be prohibitively expensive in area and power to build. When the input waveform is sampled at the optimal sampling phase, the energy at Nyquist and beyond can get constructively aliased, increasing the signal to noise ratio (SNR) and improving BER performance.

In N-reader HDD application, however, there may be N AFEs with N ADCs, producing N sampled data streams to be combined. To maintain deterministic coherence when combining these streams, they can be implemented on a single clock domain; e.g. the N ADCs can be clocked by a single clock. Operating the N ADCs on a single clock may constrain the sampling phases of the individual streams and can place the burden of sub-T delay matching (e.g. matching the signals from the N ADCs even though the delay between heads may be less than 1T, with "T" being a single clock cycle) to digital discrete circuitry. The described system 300 may be used to implement the digital delay matching which supports single clocking, and can be used to maximize the performance gains from optimal sampling under these constraints.

The system 300 may include an example MSMR system including two reader elements, reader 1 302 and reader 2 304. Each reader in an MSMR system may have a corresponding analog front end (AFE), analog to digital converter (ADC), delay module, and gain, offset, and multiresolution analysis (MRA) loops. For example, reader 1 302 may have corresponding AFE 1 306, ADC 1 310, delay 1 314, and gain, offset, and MRA loops 318. Reader 2 304 may have AFE 2 308, ADC 2 312, delay 2 316, and gain, offset, and MRA loops 320.

The readers may provide the received signal to the analog front ends (AFEs), which may be circuitry configured to condition an analog signal via amplifiers, filters, and other operations, before providing the conditioned signal to other components for further processing. An analog to digital converter (ADC) may periodically sample the conditioned analog signal (e.g. determine a digital value from the analog waveform) at a frequency controlled by a timing control system, which may include a timing loop 322, a digital phase converter (DPC) 324, and a digital phase-locked loop (DPLL). The DPLL 326 may generate clock signals at a nominal frequency via an electronic oscillator. The timing loop 322 may modify the clock phase via the DPC 324 so that the ADCs sample the signal correctly. As described herein, the clock signals generated by the timing control system control a clock domain, including the elements directly clocked by the signal from the oscillator as well as some components attached to the outputs of the clocked elements. For example, the components of system 300 may all be within a single clock domain. The clock signal frequency may be modified by adjusting the frequency at which clock signals are generated, or by applying an interpolation filter to the clock signals. Sampling a signal may include converting a continuous physical quantity (e.g. voltage) of the signal into a digital number or value representing the quantity's amplitude (e.g. using 6 bits or more of precision per sample). The sampled values may be used to determine patterns in the signal which may be used to extract digital bits of information from the signal.

The digital values from ADC 1 310, ADC 2 312, or both may be delayed at delay circuit 1 314 and delay circuit 2 316, respectively, so that the signals from different readers can be temporally aligned for later combining. Delay circuit 1 314 and delay circuit 2 316 may be fractional delay aligners that enable the fractional delay of samples. A fractional delay may be a delay with a granularity of less than 1 sampling period T. The sampling period or sampling interval may be the time difference between when two consecutive ADC samples are taken, where a sample may be taken once in every time interval T. In some embodiments, the delay can be controlled in T/64 increments between 0 and (1023/64)T (e.g. between 0 and 15 63/64T), where T is the sampling period. The implementation of these circuits is further detailed below. A delay calibration module 328 may adjust the delays in order to make the delayed signals as similar as possible, for example based on a least squares algorithm. The delay calibration module 328 may use stored delay values to set the delays for the different heads based on the current zone or track being read from, may adjust the delays based on comparing the delayed signals from the delay modules to keep the signals aligned, or a combination thereof.

Once an appropriate delay has been applied to both signals so that they are aligned, the signals can be provided to a combining circuit 330 configured to combine the signals. The combining circuit may be configured to weigh the signals from the various readers differently, at multiplier circuits W1 and W2. For example, certain readers may be known to be more reliable, better centered over the target track, sampling at an optimal sampling phase relative to the other readers, or otherwise preferred. The weights W1 and W2 may add up to 1 or another selected value. For example, reader 1 302 may be the preferred reader, and reader 2 304 may be less preferred. At the combining circuit 330, the signal from reader 1 302 may be assigned a 0.7 weight at W1, while the signal from reader 2 304 may be assigned a 0.3 weight at W2, so that the total weights add up to 1 when the signals are combined. The weighted signals may then be combine at a summation circuit of the combining circuit 330.

The combined signal may be provided to a detector 332, which may determine the bit sequence provided by the signal based on the sampled values from the ADCs (e.g. whether the sample values indicate a 1 or a 0). The detected bit stream may be passed further along the R/W channel, e.g. to a decoder (not shown), which may decode the bit stream into usable data.

The detector 332 may also provide estimates of the received data sequence to the timing loop 322. The timing loop can adjust the sampling phase in response to the samples from the detector. As such, the phase of the sampling clock supplied to ADC 1 310 and ADC 2 312 can be adjusted together.

The combining circuit 330, detector 332, and timing recovery system can be common to all N readers in the system; e.g. the same clock may be used for all ADCs. The detector 332 and timing loop circuits can be the same as those used in a single reader system, as they operate on a single sample (combined) stream and modulate a single clock.

The performance of system 300 can be further improved by the selection of a dominant reader from among the N readers. The system 300 can be adjusted to select an optimal sampling phase for the dominant reader, which can provide more performance benefits than sampling the non-dominant reader(s) at the optimal sampling phase. The optimal sampling phase may be the sampling phase that produces the best BER, and may typically be close to the phase which causes constructive folding at the Nyquist frequency. The dominant reader could be selected as the reader that can or does best detect the signal for the target media location from which the data is being read. The best or strongest reader may be determined based on signal-to-noise ratio (SNR), bit error rate (BER), or other metrics. The best reader may be selected based on the characteristics of the readers (e.g. if the readers are manufactured differently), or even by brute force (trial and error) testing, by performing reads with one head at a time and measuring their performance metrics. As an example, read tests may be performed during manufacturing to determine a dominant reader for each selected area of the storage media, such as for each zone. A zone may include a plurality of concentric data tracks on a single surface of a disc, with each disc surface potentially having many zones.

Accordingly, the delay calibration circuit 328 may be configured to set the delay circuit corresponding to the dominant reader to a fixed integer value (in T) in order to have the dominant reader sampling at an optimal sampling phase. The timing loop of the system 300 may be configured to adjust and optimize the sampling phase of the dominant reader as in a single-reader system, so as to obtain the most reliable sampling of the signal waveform using the dominant reader. The delay calibration circuit 328 may set delays for the other non-dominant readers based on their down-track offset from the dominant reader, so that the waveforms from all N readers are aligned for combining. The down-track offset between the heads, which may change from zone-to-zone and track-to-track, may result in the signal from the non-dominant readers being sampled at sub-optimal sampling phases (e.g. with fractional T offsets from the dominant reader), but still providing overall improvement in BER and SNR in the final combined signal.

For example, a determination may be made that reader 1 302 may be set as the dominant reader for a current I/O operation. The delay calibration circuit 328 may set the delay for reader 1 302 at the delay 1 circuit 314 to be an integer value (e.g. 8T). The integer delay for the dominant reader may be set at an approximate midpoint in delays the system can perform, especially in systems with more than two readers, to assure all the non-dominant readers can be accommodated with shorter or longer delays than the dominant reader. For example, an 8T delay may be selected for the dominant reader when the system is configured for a 16T delay range, with the non-dominant readers potentially having delays greater or less than 8T.

After the delay is selected for the dominant reader 1 302, a delay for reader 2 may be set at the delay 2 circuit 316, based on a down-track offset or delay for reader 2 304 relative to reader 1 302. For example, reader 2 304 may be a leading head relative to reader 1, such that reader 2 would sample a portion of the signal waveform prior to reader 1, and would therefore need a longer delay than reader 1. The down-track timing offset for reader 2 304 may be 2 and 17/64T relative to reader 1 302. Accordingly, the delay at the delay 2 circuit 316 may be set to 10 17/64T (e.g. the 8T delay for reader 1 302 plus the 2 17/64T relative offset of reader 2 304). Once the offsets of the non-dominant readers are selected, the delay calibration circuit 328 may set the delay for the dominant reader to some minimum integer value which still keeps all reader delays positive. This may minimize the latency of the combined signal, thus improving feedback loop performance (e.g. timing, offset, gain, MRA). In the current example, the delay for reader 1 302 may be set to 0T and the delay for reader 2 304 may be set to 2 17/64T. In systems where some minimal delay may be kept for, e.g. thermal variation, the delay for reader 1 302 may be set to 1T and the delay for reader 2 304 may be set to 3 17/64T. In some embodiments, the delay values for each head based may be pre-determined based on the current area being read (e.g. based on testing and calibration during a manufacturing process), and the delays may therefore initially be set to values that will keep all the delays positive. In other embodiments, the delays may be determined based on calibration trials and then adjusted once the relative delays are established.

Once the delays at delay 1 314 and delay 2 316 are selected, both delay circuits may send the ADC samples from each reader corresponding to the same signal waveform to the combining circuit 330 at the same time, where the samples can be optionally weighted and combined, and then the combined signal may be sent to the detector 332.

The detector 332 may provide feedback to the timing loop, which may adjust the sampling phase for the dominant reader 1 302. The delays at delay 1 314 and delay 2 316 may be fixed once set for a particular track or zone, or the system 300 may perform continual or periodic delay tracking to adjust the delays. An example implementation of the fractional delay aligners, delay 1 314 and delay 2 316, is depicted in FIG. 4.

Figure 4:
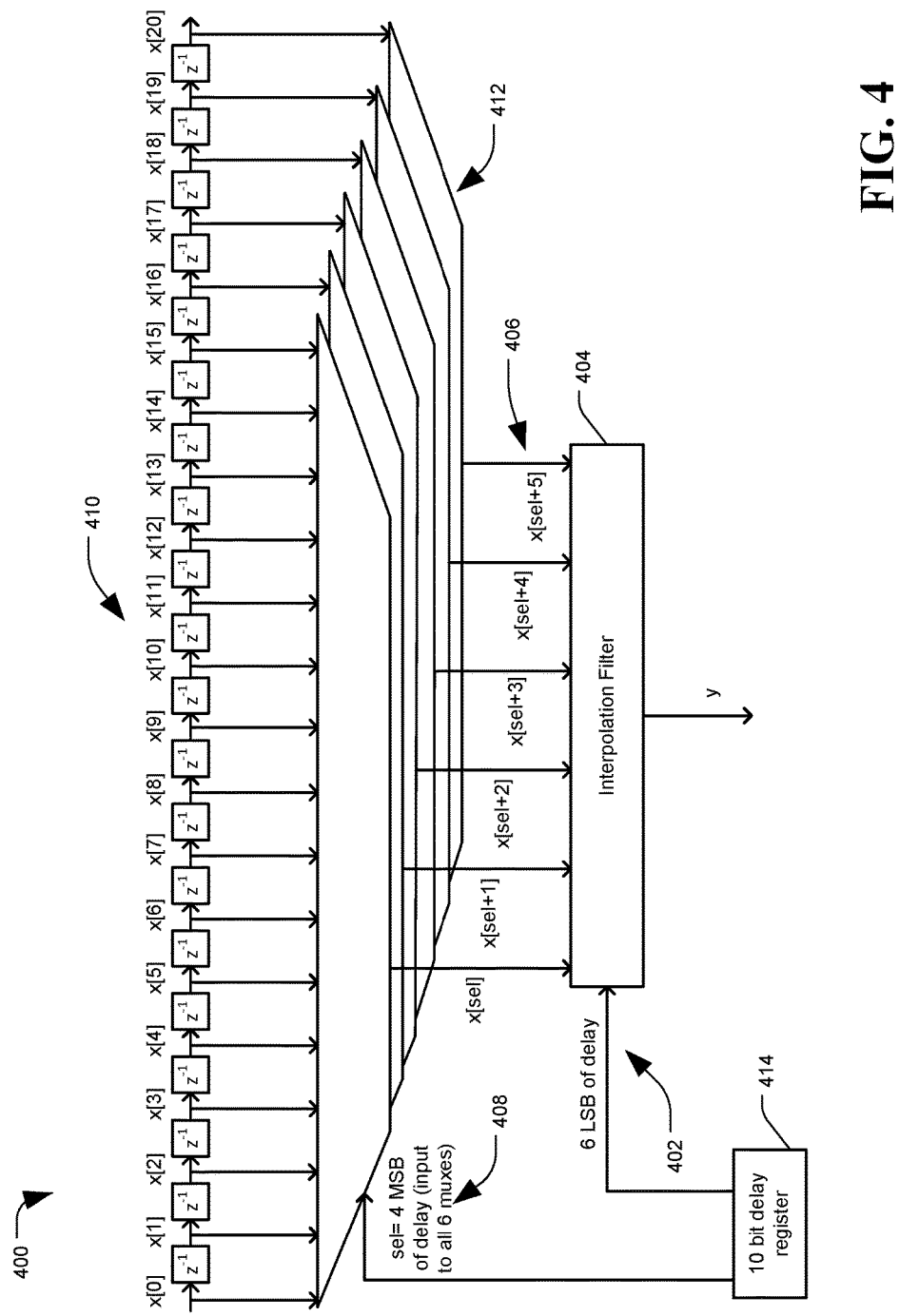
FIG. 4 is a diagram of a system configured to perform sampling for multi-reader magnetic recording, in accordance with certain embodiments of the present disclosure.

FIG. 4 is a diagram of a system configured to perform sampling for multi-reader magnetic recording, generally designated 400, in accordance with certain embodiments of the present disclosure. The system 400 may be an example implantation of a delay circuit, sometimes called a fractional delay aligner, such as delay 1 314 and delay 2 316 of FIG. 3.

The function of the fractional delay aligner 400 may be to delay the ADC samples (e.g. a 6-bit value per sample) by some time value in order to align multiple samples relative to a sampled signal waveform, before sending the delayed aligned sample values farther down the R/W channel. The delay time value may have some maximum limit expressed in T, where T is the sampling period, and the delay circuits may be configured to delay with a sub-T fractional accuracy. For example, the delay circuits may be configured for a maximum delay of 16T with a resolution of T/64. In other words, the delay value may range from (0/64)T to (1023/64)T.

In particular, actual samples values are only taken by an ADC at intervals of T. For example, ADCs for both reader 1 and reader 2 may synchronously sample their respective signals every period of time "T", but since the readers are offset, those samples will correspond to different points of the same signal waveform. The channel may be configured to sample the waveform at an optimal sampling phase with the dominant reader, which may result in other readers sampling at sub-optimal phases, meaning the other readers may not sample the waveform at exactly the same points the dominant reader does. As the system is configured to align the signals from both heads so the values from the same point on the signal waveform is sent along the channel at the same time, the fractional delay aligners 400 may be used to interpolate what sample values would be at a desired point of the signal waveform based on samples around that desired point. In this way, the value for a selected point in the waveform can be determined from each reader, even if the reader did not actually take a sample at that selected point.

The fractional delay aligner 400 may include a digital delay line 410, a series of multiplexers (or "muxes") 412, and an interpolation filter 404 having a number of taps corresponding to input lines 406 from the multiplexers 412.

The fractional delay aligner may receive a sample stream x[n], e.g. with each x[n] being a 6-bit digital sample taken by an ADC from an analog signal. The digital delay line 410 may operate to delay sample values for a delay of one sample, notated as $z^{-1}$. Accordingly, x[0] may be a current or most recent sample value received, followed by x[1], then x[2], etc., up through x[20].

Sample values may be provided from the digital delay line 410 to a set of muxers 412. A muxer or multiplexer may be a device that selects one of several input signals and forwards the selected input into a single line 406. In the depicted embodiment, the fractional delay aligner 400 may include six muxers 412, each of which may receive sixteen consecutive sample values over sixteen input lines. A first muxer may receive the sixteen most recent sample values {x[0]: x[15]}, the next muxer receives a set of sixteen sample values one sample older {x[1]: x[16]}, and so on, until the last muxer receives the oldest sixteen sample values {x[5]: x[i+20]}.

In an example embodiment, the delay to each fractional delay aligner 400 may be specified as a 10-bit control value, delay[9:0] (e.g. a delay value with ten bit positions from 9 to 0). In normal operation, this control may be adapted by a delay tracking block (e.g. the delay calibration circuit 328 of FIG. 3); however, it may also be initialized or overridden through register control. For example, initial delay values may be stored based on zone, which may be loaded into a delay register 414 by the delay calibration circuit or another circuit, and the delay calibration circuit may track and adjust the delay during read operations. The 4 MSBs (most significant bits, e.g. bit positions 9 through 6 of delay[9:0]) of the delay value can specify the integer delays (e.g. 0T through 15T), which may be provided to the muxes 412 via delay line 408. The 4 MSB may operate as a selection indicator "sel" for which six sample values x[n] to provide from the muxes 412 to the interpolation filter 404. The "sel" value may identify a particular sample, e.g. x[i], with the first mux configured to send along x[i], the second mux sending x[i+1], etc. as outputs 406 to the interpolator 404. So if the 4 MSB identifies x[8], x[sel] is x[8], while x[sel+5] is x[13].

The 6 LSBs 408 (least significant bits, e.g. bit positions 5 through 0 of delay [9:0]) may specify the fractional delay (e.g. T/64), and may be provided to the interpolation filter 404 via delay line 402. The interpolation filter 404 may be configured to apply weights to the values of the six sample values x[sel] through x[sel+5], with the weights based on the fractional delay value. Accordingly, the interpolation filter 404 may interpolate a value of the sampled signal at the selected fractional delay point based on sampled values around the selected point. The value of the delayed signal at the specified delay point may be output as a value y from the fractional delay aligner 400, which value may be passed down a data channel for combining with the value from other readers, and should be aligned with the other readers.

As shown, the example interpolation filter 404 used for fractional delays may have six taps corresponding to the six inputs 406 from the multiplexers 412. The interpolation weights applied for each tap may be determined by the 6 LSBs 402 of the delay control value and implement a windowed Sinc function. The numerical values are shown in the table of FIG. 5.

FIG. 5 is a table of delay circuit interpolation weights, generally designated 500, in a system configured to perform sampling for multi-reader magnetic recording, in accordance with certain embodiments of the present disclosure. In particular, the table 500 depicts a set of six weight values, w[0] through w[5], for a set of six taps into an interpolator of a fractional delay aligner circuit as discussed in regard to FIG. 4. The weights applied to each received sample value from the six taps may affect how much influence that sample has on the interpolated signal value output from the interpolation filter. The various weight values may be known relative to the fractional delay component (e.g. the 6 LSBs) of the delay control value. For example, the weights to apply may be retrieved from a lookup table (LUT) based on the delay value "T" of the 6 LSBs. In the depicted example, if the 6 LSBs equal a value of 13, a lookup table may be accessed to retrieve weights for the 6 taps of 5, −16, 118, 28, −8, 2.

As the range of potential weight values for each tap may be known a-priori and constrained by tap location, the weight representations and multiplier sizes can be optimized, to minimize the storage required for the lookup table or weight values. For example, the w[0] tap weight values may range from 0 to 6, which can be represented with 3 bits, while the w[2] weight values may range from 2 to 127, which may be represented with 5 bits. In particular, the multipliers can be {3,5,7,7,5,3}-bit by 6-bit for the 6 weights respectively. The interpolator output can be computed as (Equation 1):

$$y[t]\left(\left(\sum_{i=0}^{5} w[i] * x[i + \text{delay}[9:6]]\right) + 64\right) >> 7, \text{ where } x[j] = adc[t + j],$$

based on a delay time "t". The interpolator output y[t] may be saturated to 6-bits. The output y may be 6-bits representing a sample value from a point of the data signal corresponding to the selected delay, with sub-T accuracy.

Figure 6:
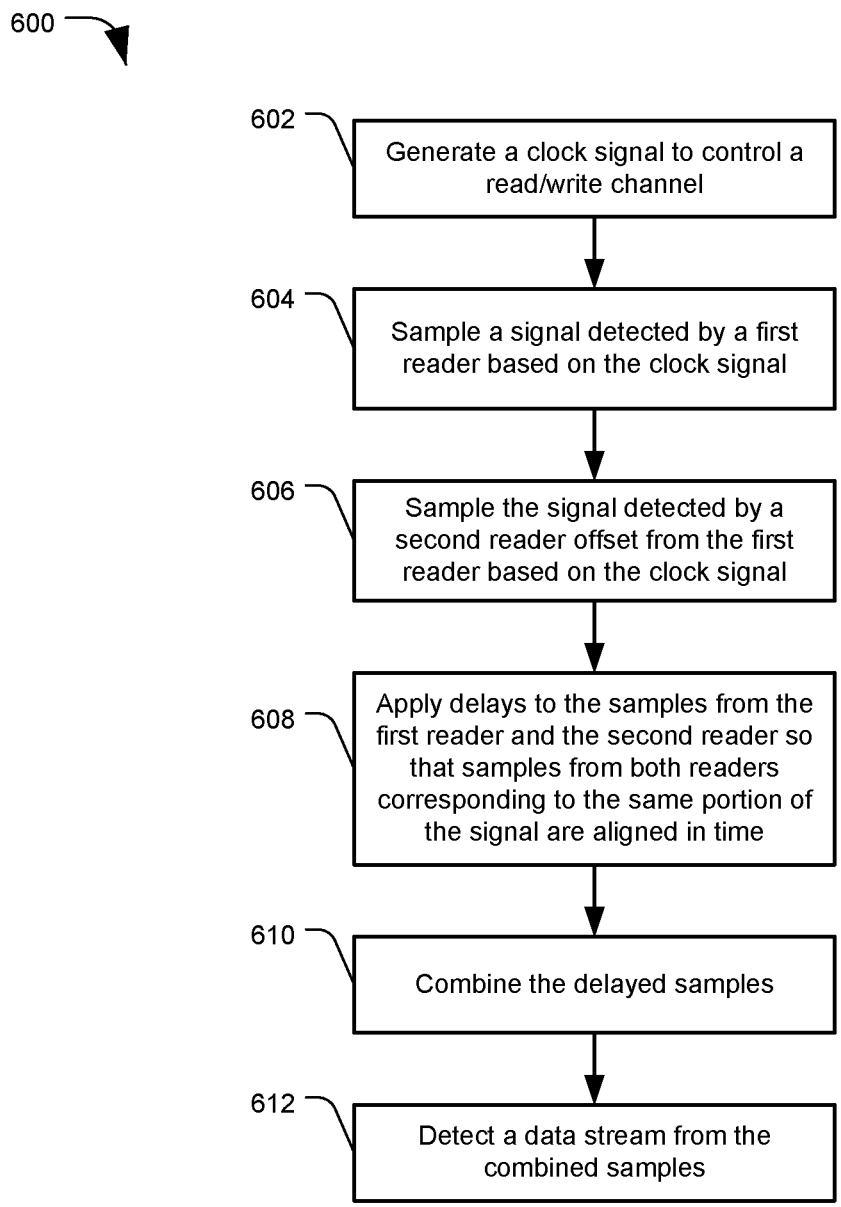
FIG. 6 is a flowchart of a method of sampling for multi-reader magnetic recording, in accordance with certain embodiments of the present disclosure.

FIG. 6 is a flowchart of an example method 600 of sampling for multi-reader magnetic recording, in accordance with certain embodiments of the present disclosure. The method 600 may be performed by circuits, computer-executable instructions, or any combination thereof, such as by the read/write (R/W) channel depicted in FIGS. 1 and 3.

The method 600 may include generating a clock signal to control a R/W channel, at 602. The R/W channel may be a multi-reader channel, with multiple readers simultaneously detecting the sample signal patterns, but at different points along the signal pattern. The detected signal pattern from each reader may be sampled by a corresponding analog to digital converter (ADC) at a frequency controlled by the single clock of the R/W channel.

The method 600 may include sampling the signal detected by a first reader based on the clock signal, at 604, and sampling the signal detected by a second reader offset from the first reader (e.g. in a down-track direction) based on the same clock signal, at 606. There may be more than two readers and therefore more portions of the signal being sampled based on the clock signal in some implementations.

The method 600 may include applying delays to the samples from the first reader and the second reader in order to align the samples that correspond to the same portion of the signal from both readers, at 608. The delays may be based on the down-track offset between the readers that can create a temporal delay between when each reader detects the same portion of the signal waveform.

The delayed samples may be combined, at 610. Different weights may be applied to the samples from different readers, for example based on whether a reader is dominant and known to perform better signal detection, how well centered over a target track a given reader is, or based on other factors. For example, the sample values from a dominant reader may be multiplied by 0.7, while the sample values from the non-dominant reader may be multiplied by 0.3, and the weighted values may be added together to provide the combined sample value. The combined samples may provide a superior signal to noise rate or ratio (SNR) than sampling performed for a single reader. At 612, the combined samples may be provided to a detector in order to detect a bit pattern based on the sample values, in order to convert the analog signal into a digital bit sequence. A more detailed example method of performing an I/O operation in a multi-reader magnetic recording system is described in regard to FIG. 7.

Figure 7:
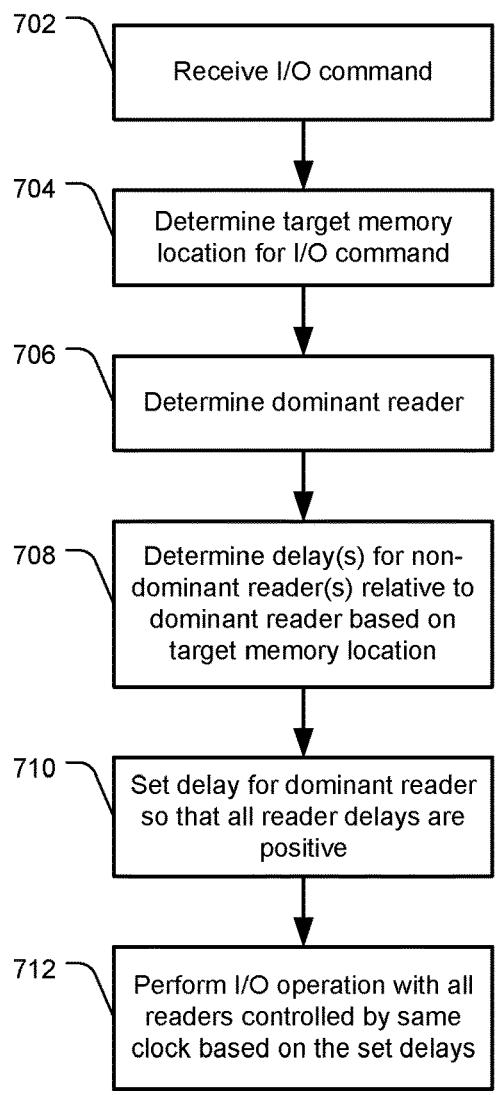
FIG. 7 is a flowchart of a method of sampling for multi-reader magnetic recording, in accordance with certain embodiments of the present disclosure.

FIG. 7 is a flowchart of an example method 700 of sampling for multi-reader magnetic recording, in accordance with certain embodiments of the present disclosure. The method 700 may be performed by circuits, computer-executable instructions, or any combination thereof, such as by the read/write (R/W) channel depicted in FIGS. 1 and 3.

Method 700 may include receiving an I/O command to execute, at 702. For example, the command may be received at a data storage device from a host device. At 704, the method 700 may include determining the target memory location corresponding to the I/O command. For example, the command may specify an LBA range of data to retrieve, and the system may consult a logical-to-physical address mapping table to determine a physical location on the storage media corresponding to the requested LBA range. Determining the target memory location may include determining a zone where the data is stored, a track to which the data is stored, individual physical addresses, or any combination thereof.

The method 700 may include determining a dominant reader from among multiple readers. The dominant reader may be based on which reader is likely to perform better than the other readers in detecting the signal from the target location. For example, testing may be performed during a manufacturing process to determine which reader performs best in reading back known signal patterns, based on bit error rate (BER), signal to noise ratio (SNR), or similar metrics. In some embodiments, the dominant reader may change from zone to zone or track to track, based on the arrangement of readers on the arm relative to the target track. In other embodiments, the dominant reader may be the same for all zones on a particular media surface, with the servo system configured to always center the dominant reader over the target track. Other embodiments are also possible.

The method 700 may include determining delay(s) for the non-dominant reader(s) relative to the dominant reader based on the target memory location, at 708. For example, the cross-track and down-track offsets of the readers from each other may change from zone to zone or track to track, based on a skew of the arm relative to the track. Accordingly, the delay for each head may be adjusted for different target locations so that the corresponding samples can still be accurately aligned and combined, as described herein. The delays to apply for each head for each track or zone may be stored to a lookup table, or may be determined on the fly based on detected delays in the signal pattern between readers.

At 710, the method 700 may include setting a delay for the dominant reader so that all reader delays are greater than or equal to 0). For example, the dominant reader may be the middle reader, between a leading reader and a trailing reader, with each reader offset by 2T. The delay for the dominant reader may be set to 3T, so that the leading reader has a 1T delay and the trailing reader has a 5T delay. The delay for the dominant reader may be set to an integer value, with the system configured to optimize for the sampling phase of the dominant reader.

At 712, the method 700 may include performing the I/O operation with all readers controlled by the same clock, based on the set delays. With properly set delays within a single clock domain, the samples from all readers may be combined to provide more reliable data reads. An example implementation of setting reader delays is discussed in regard to FIG. 8.

Figure 8:
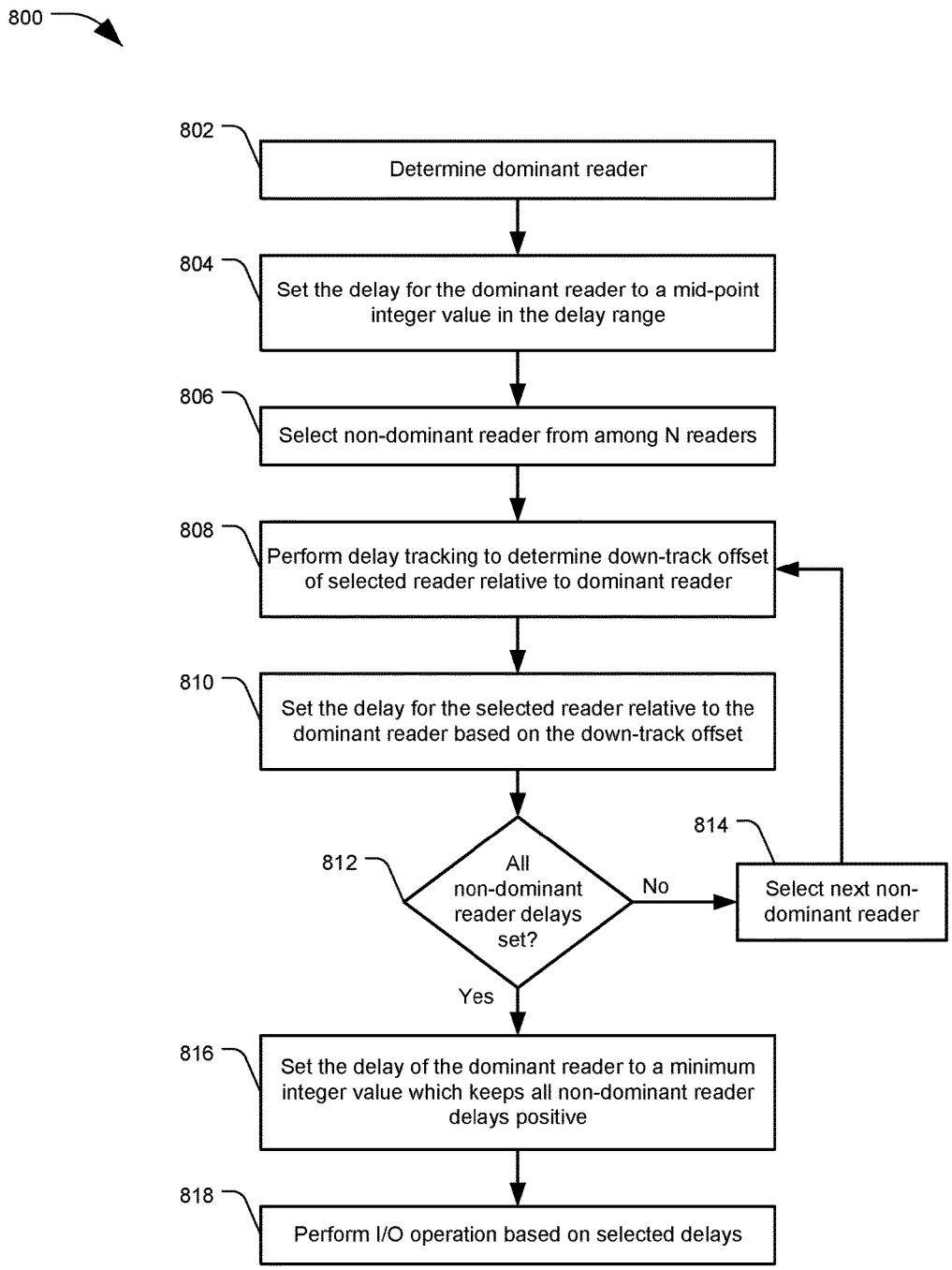
FIG. 8 is a flowchart of a method of sampling for multi-reader magnetic recording, in accordance with certain embodiments of the present disclosure.

FIG. 8 is a flowchart of an example method 800 of sampling for multi-reader magnetic recording, in accordance with certain embodiments of the present disclosure. The method 800 can be used to determine what delay control value to set for each reader in a multi-reader magnetic recording system. The method 800 may be performed by circuits, computer-executable instructions, or any combination thereof, such as by the read/write (R/W) channel depicted in FIGS. 1 and 3. Method 800 may also be performed during a manufacturing process of a data storage device, such as by a manufacturer performing performance testing on the device components.

At 802, the method 800 may include determining a dominant reader from a plurality of read heads. The storage device may use a lookup table to determine the dominant reader based on the target zone or track, or a particular reader may be set to always be the dominant reader (e.g. with one dominant read head per media surface in a system with multiple transducer arms and multiple disc memories, such as with a hard disc stack). Initially determining a dominant reader may include running the system in a single reader testing mode for each read head. Single reader mode may include performing read operations employing on a single read head from the multiple read heads, without combining the samples from the various heads. For example, a known pattern may be recorded to a target location, and the system may use each read head while in single reader mode to determine which head can read back the known pattern with the fewest errors or highest reliability. The reader demonstrating the best reading performance may be set as the dominant reader for the relevant track, zone, or media surface.

The method 800 may include setting the delay for the dominant reader to a midpoint integer value in the available delay range of the system, at 804. For example, if the available delay range is from 0 to (1023/64)T=(15 63/64T), a midpoint integer value may include an input of (512/64) T=8T. The delay value may be input to a delay module, such as delay 1 module 314 of FIG. 3. By setting the delay of the dominant reader to a midpoint value, the delays of the non-dominant readers should also fall within the available delay range, regardless of whether those other readers precede or trail the dominant reader in down-track offset. Setting the delay to an integer value may allow for the system to optimize the sampling phase for the dominant reader.

At 806, the method 800 may include selecting a non-dominant reader from among the N readers in the multi-reader magnetic recording system, where N is an integer value. In an example implementation, the system may have three readers, with one dominant reader and two non-dominant readers. The first of the non-dominant readers may be selected, and the method 800 may include performing delay tracking to determine the down-track offset of the first non-dominant reader relative to the dominant reader, at 808. For example, the delay may be –(2 14/64)T, meaning the selected reader may be a leading head relative to the dominant reader and precede the dominant reader down the track. The determination of down-track offset between heads and the corresponding relative delays may be performed during a manufacturing process, with delay or offset values stored to a memory of the device for use during R/W operations. If the delay tracking has already been performed, the method 800 may include retrieving the stored delay values to apply for the selected non-dominant reader, at 808. The method 800 may include setting the delay for the selected reader relative to the dominant reader based on the down-track offset, at 810. For example, if the delay of the dominant reader is set to 8T, the delay for the selected reader may be set to (5 50/64)T, or (2 14/64)T less than the dominant reader delay.

A determination may be made whether all the non-dominant reader delays have been set, at 812. If not, the next non-dominant reader may be selected, at 814, and delay tracking may be performed at 808. In the example 3-reader embodiment, the second and final non-dominant reader may be selected, and a delay relative to the dominant reader of (3 59/64)T may be determined, meaning the selected reader trails the dominant reader. A delay of (11 59/64)T may be set for the third reader, or (3 59/64)T more than the dominant reader delay.

Once delays have been set for all the non-dominant readers, at 812, the method 800 may include setting the delay of the dominant reader to a minimum integer value which keeps all non-dominant reader delays positive, at 816. This may involve adjusting the delays of the dominant readers by a corresponding amount, or the delays may be stored to the delay modules as a relative amount (e.g. -(2 14/64)T and +(3 59/64)T relative to the dominant reader setting). For example, if the current minimum delay, for the leading head, is (5 50/64)T, the delay values for all heads may be reduced by an integer value of 5 while still keeping all delays positive. Accordingly, the delay for the dominant head may be changed from 8T to 3T, while the delays for the non-dominant readers may be changed from (5 50/64)T and (11 59/64)T to (50/64)T and (6 59/64)T, respectively. They delay values may be stored to memory, e.g. in a lookup table based on target media region, for access and delay calibration during regular operation. In some embodiments, the delays may be re-calculated in response to received I/O commands or at other points during device operation.

Once the delays have been determined and set, the method 800 may include performing an I/O operation based on the selected delays, at 818. An example data storage device employing the multi-reader magnetic recording system described herein is discussed in regard to FIG. 9.

Figure 9:
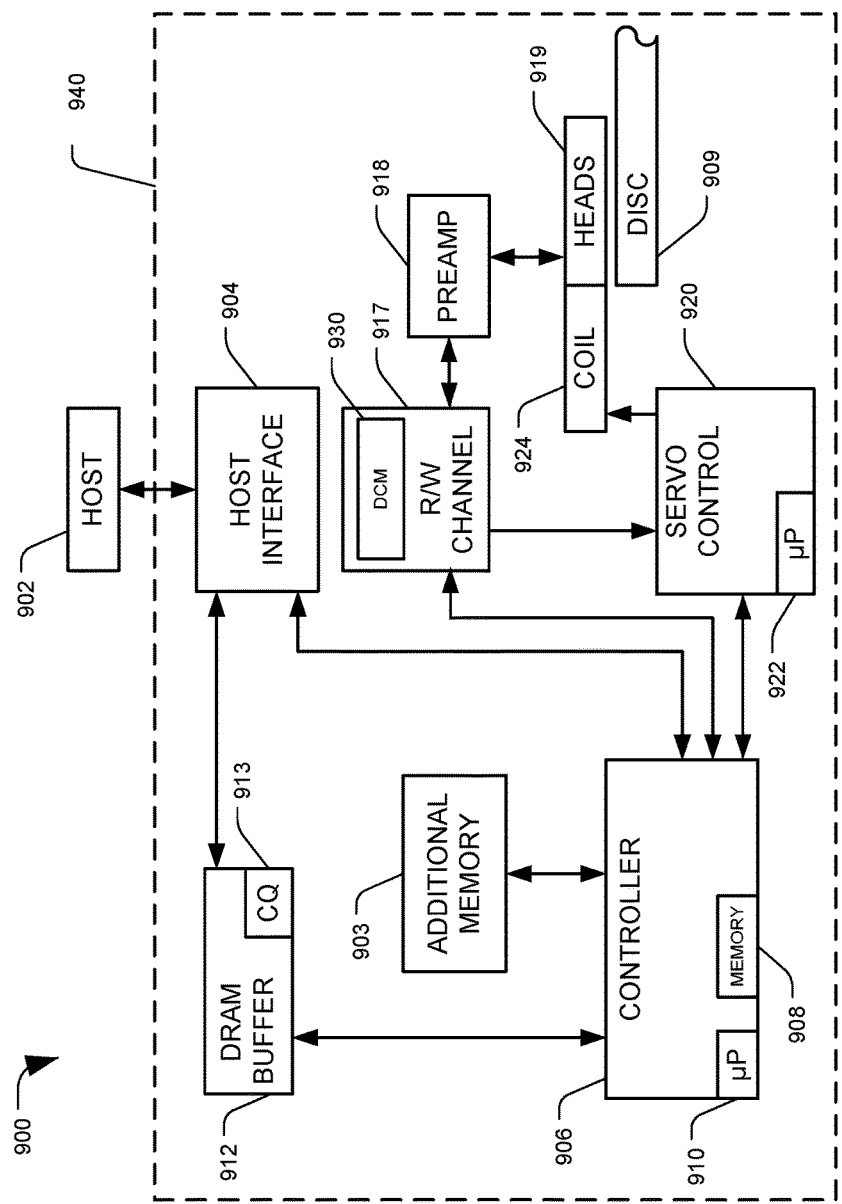
FIG. 9 is a diagram of a system configured to perform sampling for multi-reader magnetic recording, in accordance with certain embodiments of the present disclosure.

FIG. 9 is a diagram of a system configured to perform sampling for multi-reader magnetic recording, generally designated 900, in accordance with certain embodiments of the present disclosure.

Specifically, FIG. 9 provides a functional block diagram of an example data storage device (DSD) 900. The DSD 900 can communicate with a host device 902 (such as the host system 102 shown in FIG. 1) via a hardware or firmware-based interface circuit 904. The interface 904 may comprise any interface that allows communication between a host 902 and a DSD 900, either wired or wireless, such as USB, IEEE 1394, Compact Flash, SATA, eSATA, PATA, SCSI, SAS, PCIe, Fibre Channel, Ethernet, or Thunderbolt, among others. The interface 904 may include a connector (not shown) that allows the DSD 900 to be physically removed from the host 902. The DSD 900 may have a casing 940 housing the components of the DSD 900, or the components of the DSD 900 may be attached to the housing, or a combination thereof. The DSD 900 may communicate with the host 902 through the interface 904 over wired or wireless communication.

The buffer 912 can temporarily store data during read and write operations, and can include a command queue (CQ) 913 where multiple pending operations can be temporarily stored pending execution. Commands arriving over the interface 904 may automatically be received in the CQ 913 or may be stored there by controller 906, interface 904, or another component.

The DSD 900 can include a programmable controller 906, which can include associated memory 908 and processor 910. The controller 906 may control data access operations, such as reads and writes, to one or more disc memories 909.

The DSD 900 may include an additional memory 903 instead of or in addition to disc memory 909. For example, additional memory 903 can be a solid state memory, which can be either volatile memory such as DRAM or SRAM, or non-volatile memory, such as NAND Flash memory. The additional memory 903 can function as a cache and store recently or frequently read or written data, or data likely to be read soon. Additional memory 903 may also function as main storage instead of or in addition to disc(s) 909. A DSD 900 containing multiple types of nonvolatile storage mediums, such as a disc(s) 909 and Flash 903, may be referred to as a hybrid storage device.

The DSD 900 can include a read-write (R/W) channel 917, which can encode data during write operations and reconstruct user data retrieved from a memory, such as disc(s) 909, during read operations. A preamplifier circuit (preamp) 918 can apply write currents to the heads 919 and provides pre-amplification of read-back signals. In some embodiments, the preamp 918 and heads 919 may be considered part of the R/W channel 917. A servo control circuit 920 may use servo data to provide the appropriate current to the coil 924, sometimes called a voice coil motor (VCM), to position the heads 919 over a desired area of the disc(s) 909. The controller 906 can communicate with a processor 922 to move the heads 919 to the desired locations on the disc(s) 909 during execution of various pending I/O commands in the command queue 913.

DSD 900 may include a delay calibration module (DCM) 930, for example in the R/W channel 917, the controller 906, distributed among multiple components, as one or more stand-alone circuits, or any combination thereof. The DCM 930 may perform the methods and processes described herein to control the operation of multiple readers 919 on a single clock domain, and apply delays to one or more detected signals such that the read signals are aligned in time and can be coherently combined, as described herein.

Although the foregoing examples provided herein are directed to R/W channels in an MSMR data storage device, the teachings are not limited thereto and can be applied to any multi-receiver data processing channel, such as a system with multiple wireless signal antennae and a wireless signal processing channel.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
a plurality of read heads configured to simultaneously read from a single track of a storage medium, the plurality of read heads are offset in a down-track direction, where each read head of the plurality of read heads is reading a different down-track portion of a magnetic signal stored to the single track;
a plurality of analog to digital converters (ADCs) configured to receive signal patterns from the plurality of read heads;
a circuit configured to:
control the plurality of ADCs to sample the signal patterns according to a single clock signal generator; and
apply one or more delays, based on offsets of the plurality of read heads, to sample values output from the plurality of ADCs to align the sample values, where at least one ADC from the plurality of ADCs has a corresponding delay that can be individually adjusted.

2. The apparatus of claim 1 further comprising:
each ADC from the plurality of ADCs has a corresponding delay that can be individually adjusted.

3. The apparatus of claim 1 comprising the circuit further configured to:
combine the sample values output from the plurality of ADCs after the sample values have been aligned to produce combined sample values; and
detect a bit pattern from the combined sample values.

4. The apparatus of claim 3 comprising the circuit further configured to:
select a first read head from the plurality of read heads;
set a delay for a first ADC corresponding to the first read head to optimize a sampling phase of the first read head; and
set delays for other ADCs corresponding to other read heads from the plurality of read heads based on down-track offsets of the other read heads from the first read head.

5. The apparatus of claim 4 comprising the circuit further configured to:
set the delays for the other ADCs to fractional delays having a granularity of less than one sampling period T.

6. The apparatus of claim 5 comprising the circuit further configured to:
determine the read head having the best read performance among the plurality of read heads as the first read head;
perform delay tracking to determine the down-track offsets of the other heads relative to the first head; and
set the delay for the first ADC to a minimum integer value which keeps the delays for the other ADCs positive when the delays of the other ADCs relative to the first ADC are maintained based on the down-track offsets.

7. An apparatus comprising:
a magnetic data storage medium;
a read/write (R/W) channel including:
a clock signal generator;
a plurality of read heads configured to simultaneously read from a single track of the magnetic data storage medium;
a plurality of analog to digital converters (ADCs) configured to receive signal patterns from the plurality of read heads;
a circuit configured to:
select a first read head from the plurality of read heads;
operate a timing loop to optimize a sampling phase of the first read head;
set delays for other ADCs corresponding to other read heads from the plurality of read heads based on down-track offsets of the other read heads from the first read head; and
control the plurality of ADCs to sample the signal patterns according to the clock signal generator.

8. The apparatus of claim 7 further comprising:
the plurality of read heads are offset in a down-track direction, where each read head of the plurality of read heads is reading a different portion of a magnetic signal stored to the single track; and
the circuit further configured to:
apply one or more delays, based on offsets of the plurality of read heads, to sample values output from the plurality of ADCs to align the sample values, where at least one ADC from the plurality of ADCs has a corresponding delay that can be individually adjusted.

9. The apparatus of claim 8 further comprising:
each ADC from the plurality of ADCs has a corresponding delay that can be individually adjusted.

10. The apparatus of claim 8 comprising the circuit further configured to:
combine the sample values output from the plurality of ADCs after the sample values have been aligned to produce combined sample values; and
detect a bit pattern from the combined sample values.

11. The apparatus of claim 7 comprising the circuit further configured to:
set the delays for the other ADCs to fractional delays having a granularity of less than one sampling period T.

12. The apparatus of claim 7 comprising the circuit further configured to:
determine a read head having the best read performance among the plurality of read heads as a dominant read head;
perform delay tracking to determine down-track offsets of other read heads from the plurality of read heads relative to the dominant read head;
set delays for other ADCs corresponding to the other read heads based on the down-track offsets of the other read heads relative to the dominant read head; and
set a delay for a first ADC corresponding to the dominant read head to a minimum integer value which keeps the delays for the other ADCs positive when the delays of the other ADCs relative to the first ADC are maintained based on the down-track offsets.

13. A method comprising:
providing a plurality of read heads on a single actuator arm and configured to simultaneously read from a single track of a storage medium;
providing a plurality of analog to digital converters (ADCs) configured to receive signal patterns from the plurality of read heads;
determining a read head having the best read performance among the plurality of read heads as a dominant read head;
performing delay tracking to determine down-track offsets of other read heads from the plurality of read heads relative to the dominant read head;
setting delays for other ADCs corresponding to other read heads based on the down-track offsets of the other read heads; and setting a delay for a first ADC corresponding to the dominant read head to a minimum integer value which keeps the delays for the other ADCs positive; and controlling the plurality of ADCs to sample the signal patterns according to a single clock signal generator.

14. The method of claim 13 further comprising:

providing the plurality of read heads to be offset in a down-track direction, where each read head of the plurality of read heads is reading a different down-track portion of a magnetic signal stored to the single track; and applying one or more delays, based on offsets of the plurality of read heads, to sample values output from the plurality of ADCs to align the sample values, where at least one ADC from the plurality of ADCs has a corresponding delay that can be individually adjusted.

15. The method of claim 14 further comprising:

individually adjusting delays for each ADC from the plurality of ADCs.

16. The method of claim 14 further comprising:

combining the sample values output from the plurality of ADCs after the sample values have been aligned to produce combined sample values; and detecting a bit pattern from the combined sample values.

17. The method of claim 13 further comprising:

select a first read head from the plurality of read heads;

set a delay for a first ADC corresponding to the first read head to optimize a sampling phase of the first read head; and set delays for other ADCs corresponding to other read heads based on down-track offsets of the other read heads relative to the first read head, the delays for the other ADCs having a granularity of less than one sampling period T.

* * * * *